United States Patent
Kuo et al.

(10) Patent No.: US 7,259,023 B2
(45) Date of Patent: Aug. 21, 2007

(54) FORMING PHASE CHANGE MEMORY ARRAYS

(75) Inventors: Charles C. Kuo, Union City, CA (US);
Ilya Karpov, Santa Clara, CA (US);
Yudong Kim, Sunnyvale, CA (US);
Greg Atwood, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 10/939,145

(22) Filed: Sep. 10, 2004

(65) Prior Publication Data

US 2006/0054991 A1 Mar. 16, 2006

(51) Int. Cl.
*H01L 21/00* (2006.01)
(52) U.S. Cl. .............. 438/3; 438/95; 438/947; 257/E31.029
(58) Field of Classification Search .............. 438/95, 438/947, 3, 240
See application file for complete search history.

(56) References Cited

U.S. PATENT DOCUMENTS

| | | | | |
|---|---|---|---|---|
| 4,648,937 A | * | 3/1987 | Ogura et al. | 438/702 |
| 6,413,812 B1 | * | 7/2002 | Harshfield | 438/237 |
| 2003/0186481 A1 | * | 10/2003 | Lung | 438/95 |
| 2005/0112896 A1 | * | 5/2005 | Hamann et al. | 438/694 |

* cited by examiner

*Primary Examiner*—H. Jey Tsai
(74) *Attorney, Agent, or Firm*—Trop, Pruner & Hu, P.C.

(57) ABSTRACT

A phase change memory may be formed to have a dimension that is sub-lithographic in one embodiment by forming a surface feature over the phase change material, and coating the surface feature with a mask of sub-lithographic dimensions. The horizontal portions of the mask and the surface feature may then be removed and the remaining portions of the mask may be used to define a dimension of said phase change material. Another dimension of the phase change material may be defined using an upper electrode extending over said phase change material as a mask to etch the phase change material.

9 Claims, 7 Drawing Sheets

FORMING PHASE CHANGE MEMORY ARRAYS

BACKGROUND

This invention relates generally to memory devices and, particularly, to memory devices using phase change materials.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between the different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the program value represents a phase or physical state of the memory (e.g., crystalline or amorphous).

Thus, there is a need for alternate ways to provide phase change memories.

DETAILED DESCRIPTION

Figure 1:
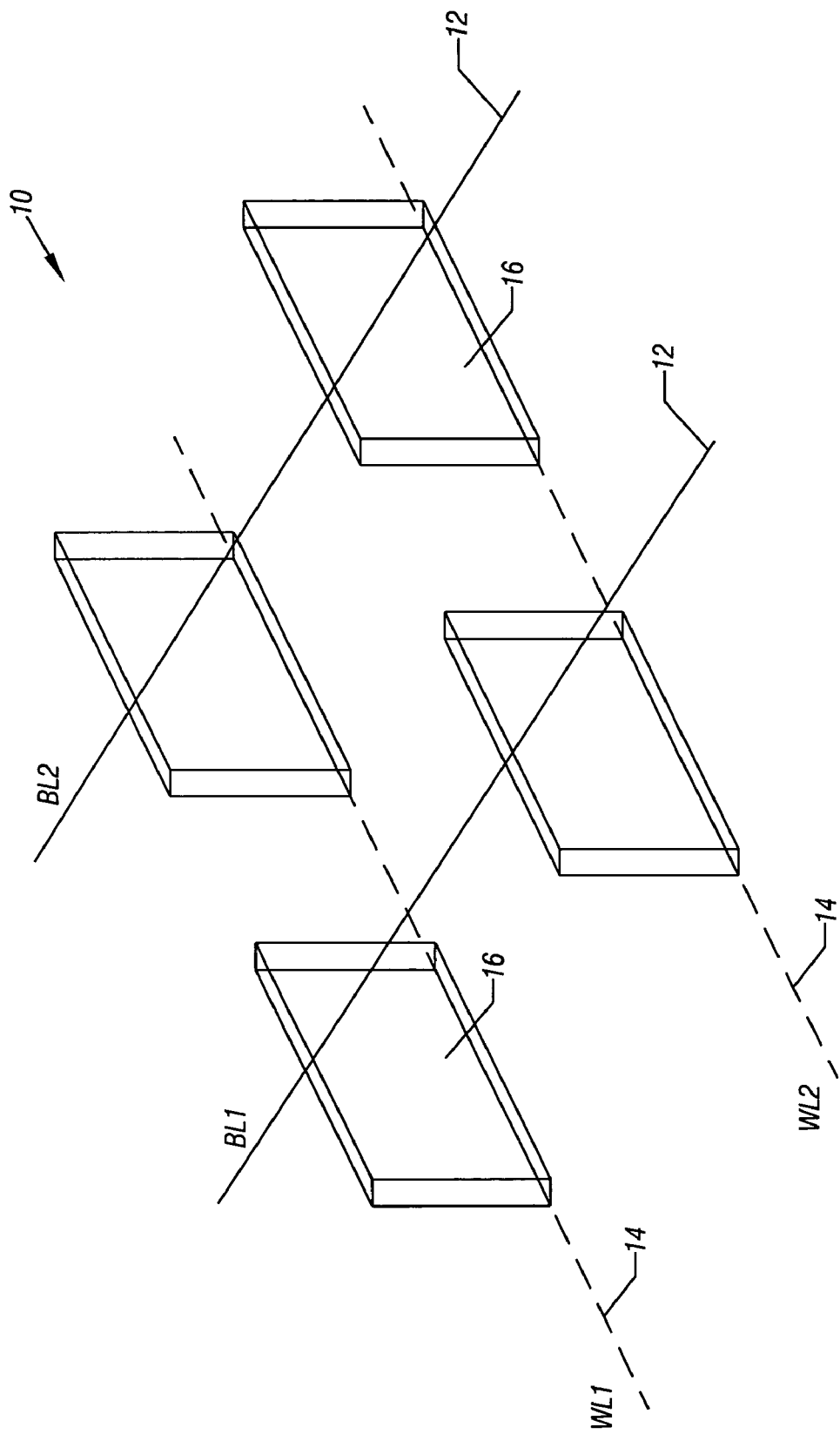
FIG. 1 is perspective view of one embodiment of the present invention simplified to only show the phase change memory stacks.

Referring to FIG. 1, a phase change memory 10 may include bitlines 12, indicated as BL1 and BL2, and wordlines 14, indicated as WL1 and WL2. Of course an orthogonal array of wordlines and bitlines may be provided which includes a much larger number of wordlines and bitlines than those depicted in FIG. 1. In addition, while the terms "wordline" and "bitline" are used herein, any addressing line may be utilized in some embodiments of the present invention. Through the addressing lines 12 and 14, a particular cell represented by a stack 16 may be addressed. The stack 16 may include layers of material, including at least one layer which includes a phase change memory material.

Each stack 16 may have an extremely small critical dimension or width in the bitline direction and a somewhat greater length extending in the wordline direction in one embodiment. Because of the extremely small dimension in at least one direction, a large number of cells may be contained in a relatively small footprint in some embodiments of the present invention.

Figure 2:
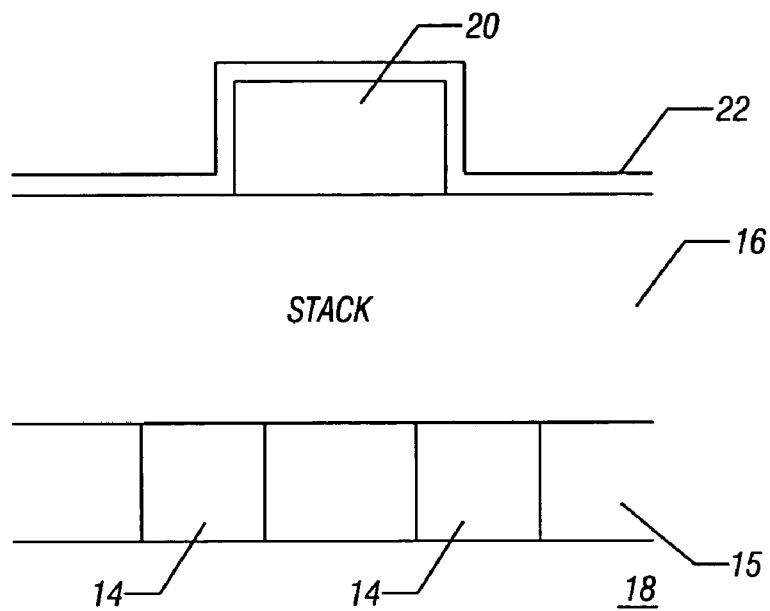
FIG. 2 is an enlarged, cross-sectional view at an early stage of manufacture in accordance with one embodiment of the present invention.

A memory array corresponding to that shown in FIG. 1 may be fabricated beginning with the structure shown in FIG. 2. The wordlines 14 have already been formed over a substrate 18. In one embodiment, the wordlines 14 may be formed by trenching an insulating layer 15 and depositing a conductive material, such as copper, in the trenches. The structure may be planarized to form the wordlines 14 that extend into the page in FIG. 2.

The phase change memory stack 16 may be defined over the wordlines 14. In one embodiment of the present invention, the stack 16 may include at least two electrodes and at least one layer of phase change memory material. In addition, in some embodiments, the stack 16 may also include an access device such as an MOS transistor, a diode, or a permanently programmed phase change memory element.

Over the stack 16 is formed a sacrificial film portion 20. One film portion 20 may be aligned over adjacent pairs of wordlines 14. The film portion 20 may be overcoated with a hard mask 22 in one embodiment of the present invention. The sacrificial film portion 20 may be formed of nitride in one embodiment of the present invention. The hard mask 22 may be an oxide, for example.

Figure 3:
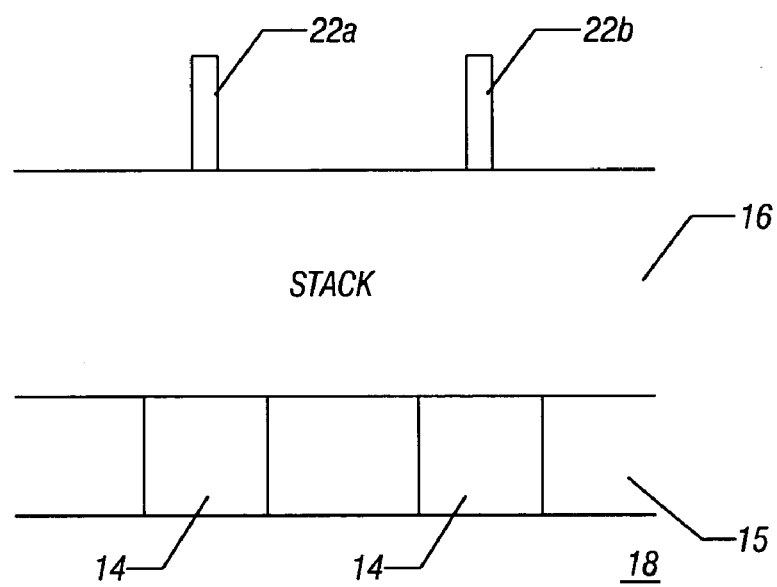
FIG. 3 is an enlarged, cross-sectional view at a subsequent stage of manufacture in accordance with one embodiment of the present invention view in a direction transverse to the length of wordlines.

As shown in FIG. 3, the horizontal portions of the hard mask 22 may be etched back. Once the sacrificial film portion 20 is exposed, the sacrificial film portion 20 may be removed by a selective etch, leaving the vertical remnants 22a and 22b of the hard mask 22. Thus, the hard mask remnants 22a and 22b may be utilized as a mask to define one dimension of two phase change memory stacks 16.

Figure 4:
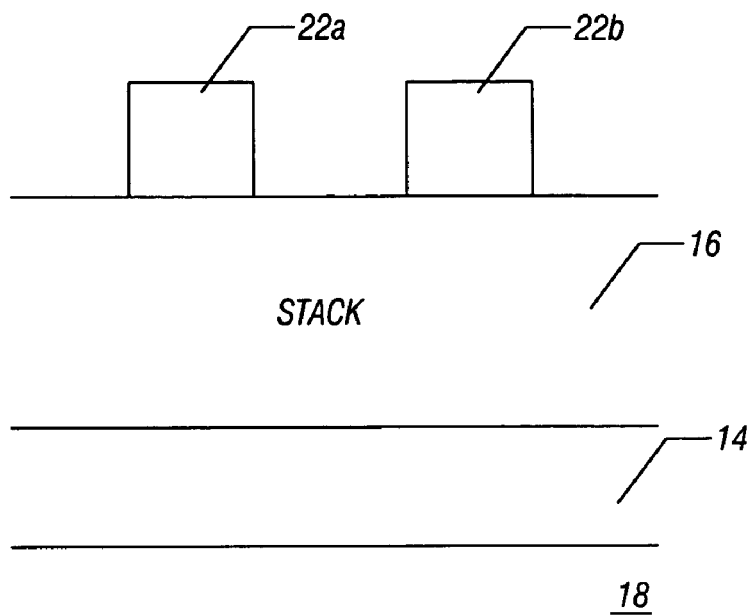
FIG. 4 is an enlarged, cross-sectional view corresponding to the structure of FIG. 3 but taken transversely to the view shown in FIG. 3.

Referring to FIG. 4, showing the same structure shown in FIG. 3 viewed along the direction of the wordline 14, the hard mask remnants 22a and 22b are longer in the wordline direction (FIG. 4) than they are in the direction transverse thereto (FIG. 3) in this embodiment.

Figure 5:
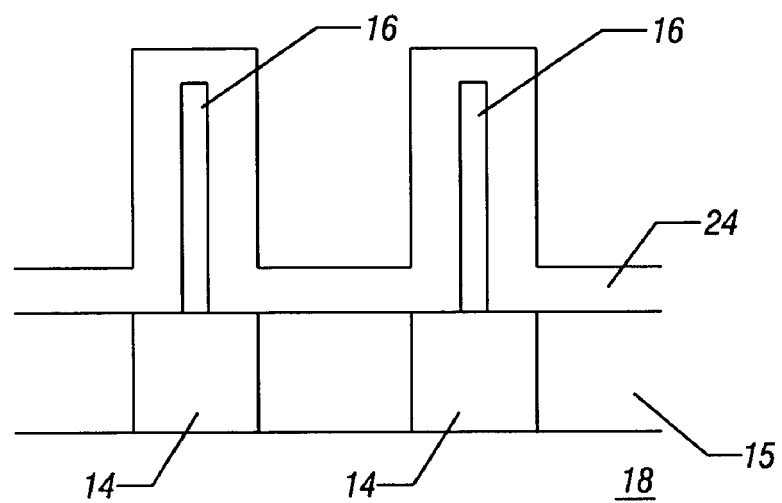
FIG. 5 is an enlarged, cross-sectional view corresponding to FIG. 3 at a subsequent stage of manufacture in accordance with one embodiment.

A self-aligned etch may be utilized to etch the stack 16. Thereafter, the remnants 22 may be removed. As a result of the self-aligned etch, thin self-aligned stacks 16 are formed as shown in FIG. 5, aligned underneath what was the hard mask remnants 22a and 22b. The stacks 16 may be relatively thin in the direction transverse to the length of the wordlines 14 because the hard mask remnants 22a and 22b were quite thin in that direction as well. By using the remnants 22 of a thin hard mask 22 as the etch mask, stacks 16 with a sub-lithographic dimension may be formed.

As shown in FIG. 5, the stacks 16 may be covered by an encapsulation layer 24 in one embodiment of the present invention. The encapsulation layer 24 may be a nitride material or other material to prevent oxygen or moisture infiltration into the phase change material included in the stack 16.

Figure 6:
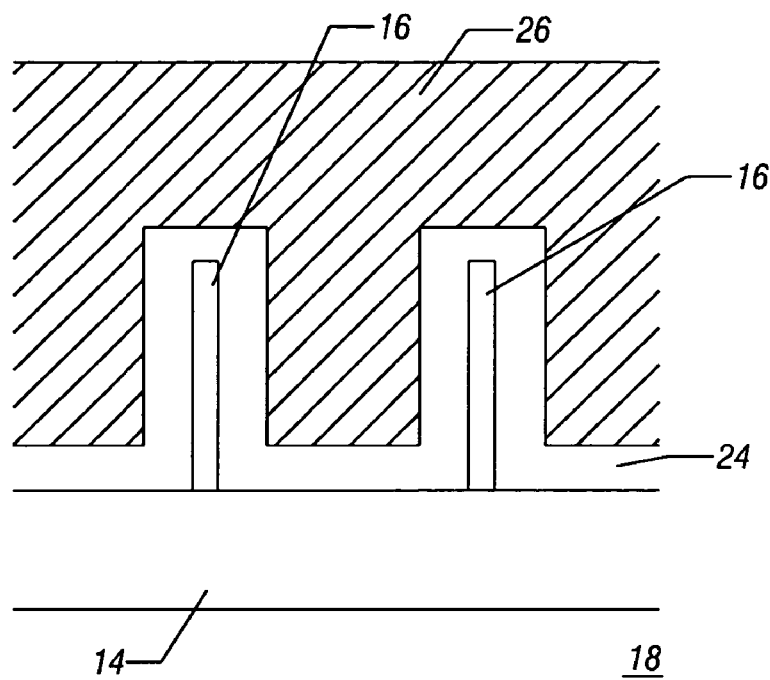
FIG. 6 is an enlarged, cross-sectional view corresponding to FIG. 5 in accordance with one embodiment of the present invention at a subsequent stage of manufacture.

After the encapsulation layer 24 has been formed, the structure may be covered with a dielectric film material 26 as shown in FIG. 6. The deposited film material 26 may then be subjected to a planarization step, such as chemical mechanical planarization.

Figure 7:
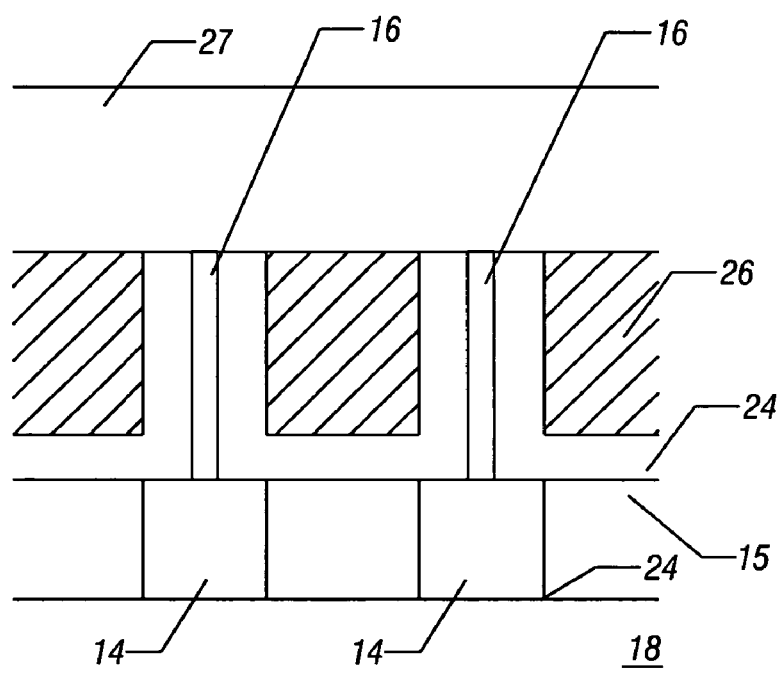
FIG. 7 is an enlarged, cross-sectional view corresponding to FIG. 5 at a subsequent stage of manufacture in accordance with one embodiment of the present invention.
Figure 9:
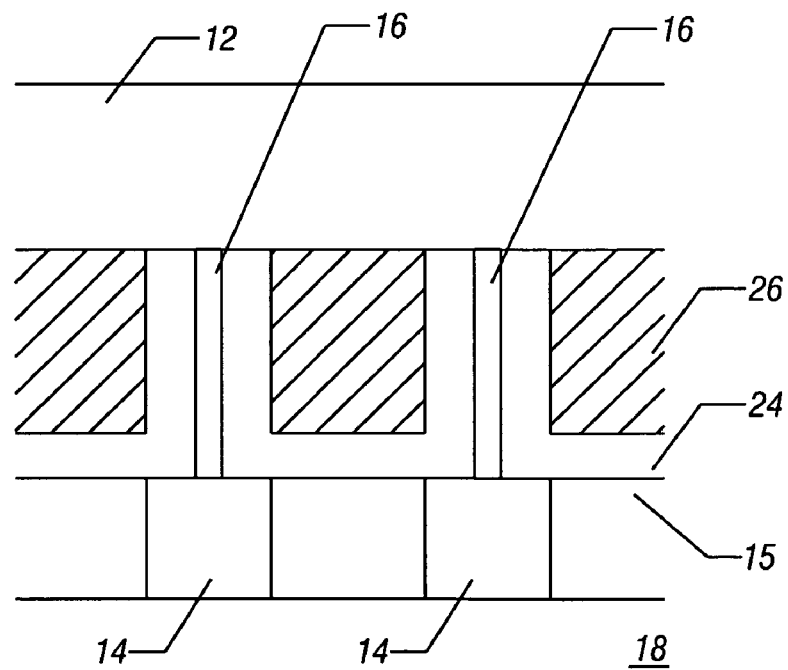
FIG. 9 is an enlarged cross-sectional view at a subsequent stage of manufacture in accordance with one embodiment of the present invention.

Thereafter, a damascene process may be utilized to form the bitlines 12 in one embodiment. Trenches 27 may be formed through the film material 26 down to the upper surface of the encapsulation layers 24 and ultimately down to the top of the stacks 16 as shown in FIG. 7. The trenches 27 may then be filled with a conductive material such as copper to form the bitlines 12 as shown in FIG. 9.

Figure 8:
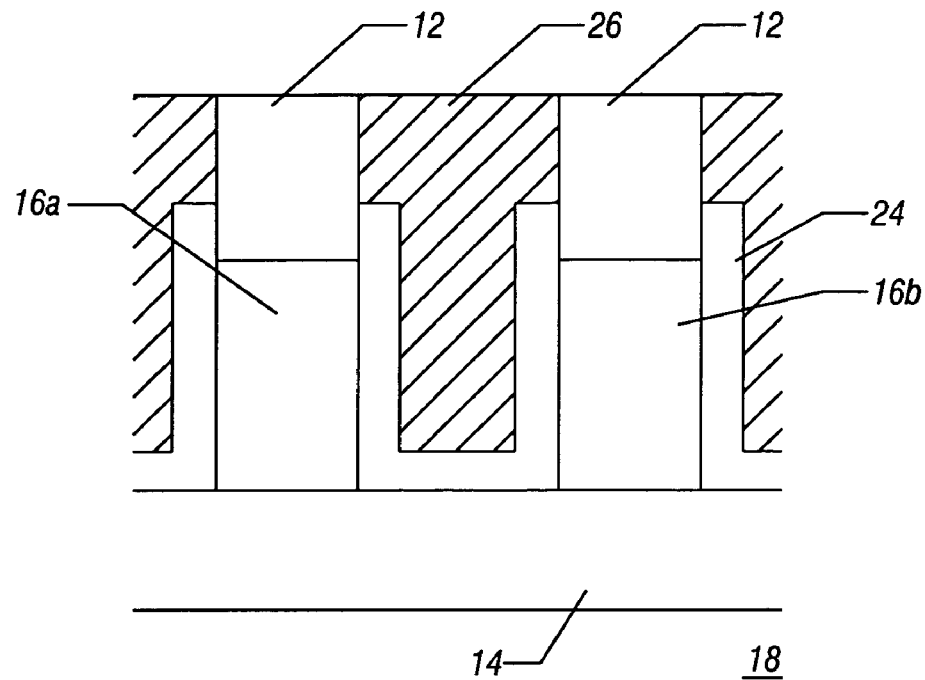
FIG. 8 is an enlarged cross-sectional view at a subsequent stage of manufacture in accordance with one embodiment of the present invention.
Figure 10:
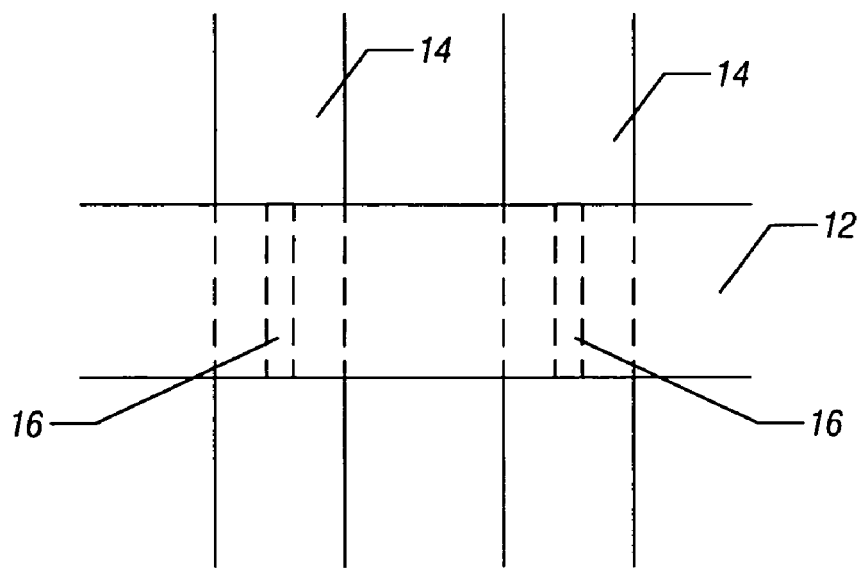
FIG. 10 is an enlarged top view at a subsequent stage of manufacture in accordance with one embodiment of the present invention.

To reduce the number of masks, the bitlines 12 may be used to pattern the stacks 16 in the direction along the lengths of the wordlines 14 in a self-aligned etch. The width of the stack 16 along the column direction is still defined by the spacer hard mask 22. However, in a damascene process, the bitline 12 can be used as a mask to define the stack 16 along the row direction as shown in FIGS. 8 and 10. Alternatively, in a process technology with aluminum bitlines, photoresists may be patterned by a column mask used to form the column and the stack in a self-aligned etch.

In one embodiment of the present invention, just three masks are needed for the process. Moreover, the second mask, which defines the position of the spacer hard mask, is the only one that requires critical registration in one embodiment.

In accordance with another embodiment of the present invention, the stack 16 may be arranged in a circular or tubular column instead of a rectangular arrangement. Other shapes may be utilized as well.

Figure 11:
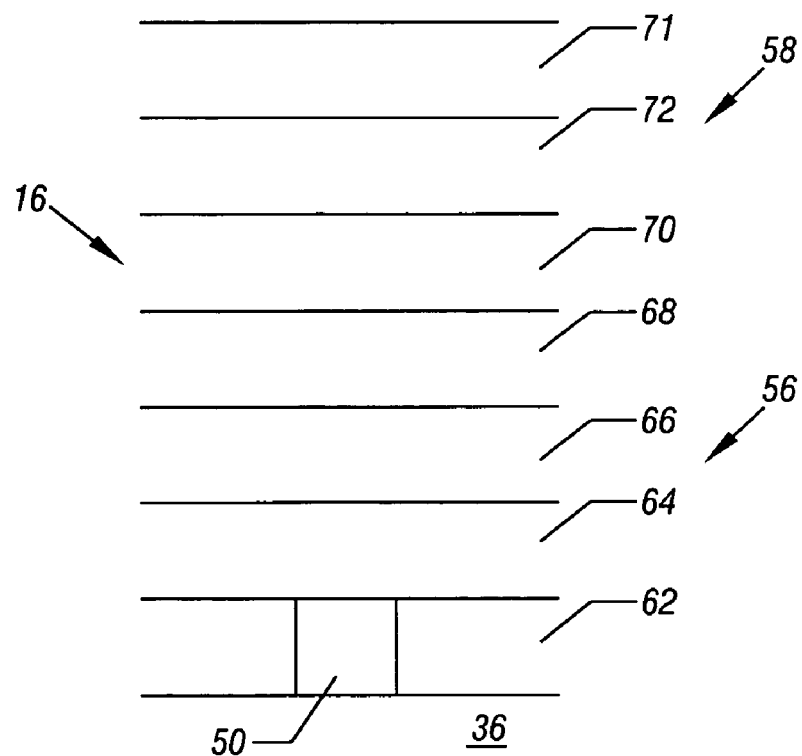
FIG. 11 is a partially enlarged, cross-sectional depiction of one embodiment of a stack.

Referring to FIG. 11, the stack 16 may include a selection device 58 formed of a phase change material including a top electrode 71, a phase change material 72, and a bottom electrode 70 in one embodiment. The selection device 58 may be permanently in the reset state in one embodiment. While an embodiment is illustrated in which the selection device 58 is positioned over the phase change memory element 56, the opposite orientation may be used as well.

Conversely, the phase change memory element 56 may be capable of assuming either a set or reset state, explained in more detail hereinafter. The phase change memory element 56 may include an insulator 62, a phase change memory material 64, a top electrode 66, and a barrier film 68, in one embodiment of the present invention. A lower electrode 60 may be defined within the insulator 62 in one embodiment of the present invention.

In one embodiment, the phase change material 64 may be a phase change material suitable for non-volatile memory data storage. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material 64 may be chalcogenide element composition from the class of tellurium-germanium-antimony ($Te_xGe_ySb_z$) material or a GeSbTe alloy, although the scope of the present invention is not limited to just these materials.

In one embodiment, if the memory material 64 is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material 64 in the substantially amorphous state is greater than the resistance of the memory material in the substantially crystalline state. Accordingly, in this embodiment, the memory material 64 may be adapted to be altered to a particular one of a number of resistance values within a range of resistance values to provide digital or analog storage of information.

Programming of the memory material to alter the state or phase of the material may be accomplished by applying voltage potentials to the lines 12 and 14, thereby generating a voltage potential across the memory material 64. An electrical current may flow through a portion of the memory material 64 in response to the applied voltage potentials, and may result in heating of the memory material 64.

This heating and subsequent cooling may alter the memory state or phase of the memory material 64. Altering the phase or state of the memory material 64 may alter an electrical characteristic of the memory material 64. For example, resistance of the material 64 may be altered by altering the phase of the memory material 64. The memory material 64 may also be referred to as a programmable resistive material or simply a programmable resistance material.

In one embodiment, a voltage potential difference of about 0.5 to 1.5 volts may be applied across a portion of the memory material by applying about 0 volts to a line 14 and about 0.5 to 1.5 volts to the line 12. A current flowing through the memory material 64 in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material 64 may be heated to a relatively higher temperature to amorphisize memory material and "reset" memory material. Heating the volume or memory material to a relatively lower crystallization temperature may crystallize memory material and "set" memory material. Various resistances of memory material may be achieved to store information by varying the amount of current flow and duration through the volume of memory material.

The information stored in memory material 64 may be read by measuring the resistance of the memory material. As an example, a read current may be provided to the memory material using opposed lines 12, 14 and a resulting read voltage across the memory material may be compared against a reference voltage using, for example, a sense amplifier. The read voltage may be proportional to the resistance exhibited by the memory storage element.

In order to select a stack 16 on a bitline 12 and wordline 14, the selection device 58 for the selected cell at that location may be operated. The selection device 58 activation allows current to flow through the memory element 56 in one embodiment of the present invention.

In a low voltage or low field regime A, the device 58 is off and may exhibit very high resistance in some embodiments. The off resistance can, for example, range from 100,000 ohms to greater than 10 gigaohms at a bias of half the threshold voltage. The device 58 may remain in its off state until a threshold voltage $V_T$ or threshold current $I_T$ switches the device 58 to a highly conductive, low resistance on state. The voltage across the device 58 after turn on drops to a slightly lower voltage, called the holding voltage $V_H$ and remains very close to the threshold voltage. In one embodiment of the present invention, as an example, the threshold voltage may be on the order of 1.1 volts and the holding voltage may be on the order of 0.9 volts.

After passing through the snapback region, in the on state, the device 58 voltage drop remains close to the holding voltage as the current passing through the device is increased up to a certain, relatively high, current level. Above that current level the device remains on but displays a finite differential resistance with the voltage drop increasing with increasing current. The device 58 may remain on until the current through the device 58 is dropped below a characteristic holding current value that is dependent on the size and the material utilized to form the device 58.

In some embodiments of the present invention, the selection device 58 does not change phase. It remains permanently amorphous and its current-voltage characteristics may remain the same throughout its operating life.

As an example, for a 0.5 micrometer diameter device 58 formed of TeAsGeSSe having respective atomic percents of 16/13/15/1/55, the holding current may be on the order of 0.1 to 100 micro-ohms in one embodiment. Below this holding current, the device 58 turns off and returns to the high resistance regime at low voltage, low field. The threshold current for the device 58 may generally be of the same order as the holding current. The holding current may be altered by changing process variables, such as the top and bottom electrode material and the chalcogenide material. The device 58 may provide high "on current" for a given area of device compared to conventional access devices such as metal oxide semiconductor field effect transistors or bipolar junction transistors.

In some embodiments, the higher current density of the device 58 in the on state allows for higher programming current available to the memory element 56. Where the memory element 56 is a phase change memory, this enables the use of larger programming current phase change memory devices, reducing the need for sub-lithographic feature structures and the commensurate process complexity, cost, process variation, and device parameter variation.

One technique for addressing the array uses a voltage V applied to the selected bitline 12 and a zero voltage applied to the selected wordline 14. For the case where the device 56 is a phase change memory, the voltage V is chosen to be greater than the device 58 maximum threshold voltage plus the memory element 56 reset maximum threshold voltage, but less than two times the device 58 minimum threshold voltage. In other words, the maximum threshold voltage of the device 58 plus the maximum reset threshold voltage of the device 56 may be less than V and V may be less than two times the minimum threshold voltage of the device 58 in some embodiments. All of the unselected rows and columns may be biased at V/2.

With this approach, there is no bias voltage between the unselected rows and unselected columns. This reduces background leakage current.

After biasing the array in this manner, the memory elements 56 may be programmed and read by whatever means is needed for the particular memory technology involved. A memory element 56 that uses a phase change material may be programmed by forcing the current needed for memory element phase change or the memory array can be read by forcing a lower current to determine the device 56 resistance.

For the case of a phase change memory element 56, programming a given selected bit in the memory 10 can be as follows. Unselected rows and columns may be biased as described for addressing. Zero volts is applied to the selected row. A current is forced on the selected column with a compliance that is greater than the maximum threshold voltage of the device 58 plus the maximum threshold voltage of the device 56. The current amplitude, duration, and pulse shape may be selected to place the memory element 56 in the desired phase and thus, the desired memory state.

Reading a phase change memory element 56 can be performed as follows. Unselected rows and columns may be biased as described previously. Zero volts is applied to the selected row. A voltage is forced at a value greater than the maximum threshold voltage of the device 58, but less than the minimum threshold voltage of the device 58 plus the minimum threshold voltage of the element 56 on the selected column. The current compliance of this forced voltage is less than the current that could program or disturb the present phase of the memory element 56. If the phase change memory element 56 is set, the access device 58 switches on and presents a low voltage, high current condition to a sense amplifier. If the element 56 is reset, a larger voltage, lower current condition may be presented to the sense amplifier. The sense amplifier can either compare the resulting column voltage to a reference voltage or compare the resulting column current to a reference current.

The above-described reading and programming protocols are merely examples of techniques that may be utilized. Other techniques may be utilized by those skilled in the art.

To avoid disturbing a set bit of memory element 56 that is a phase change memory, the peak current may equal the threshold voltage of the device 58 minus the holding voltage of the device 58 that quantity divided by the total series resistance including the resistance of the device 58, external resistance of device 56, plus the set resistance of device 56. This value may be less than the maximum programming current that will begin to reset a set bit for a short duration pulse.

Figure 12:
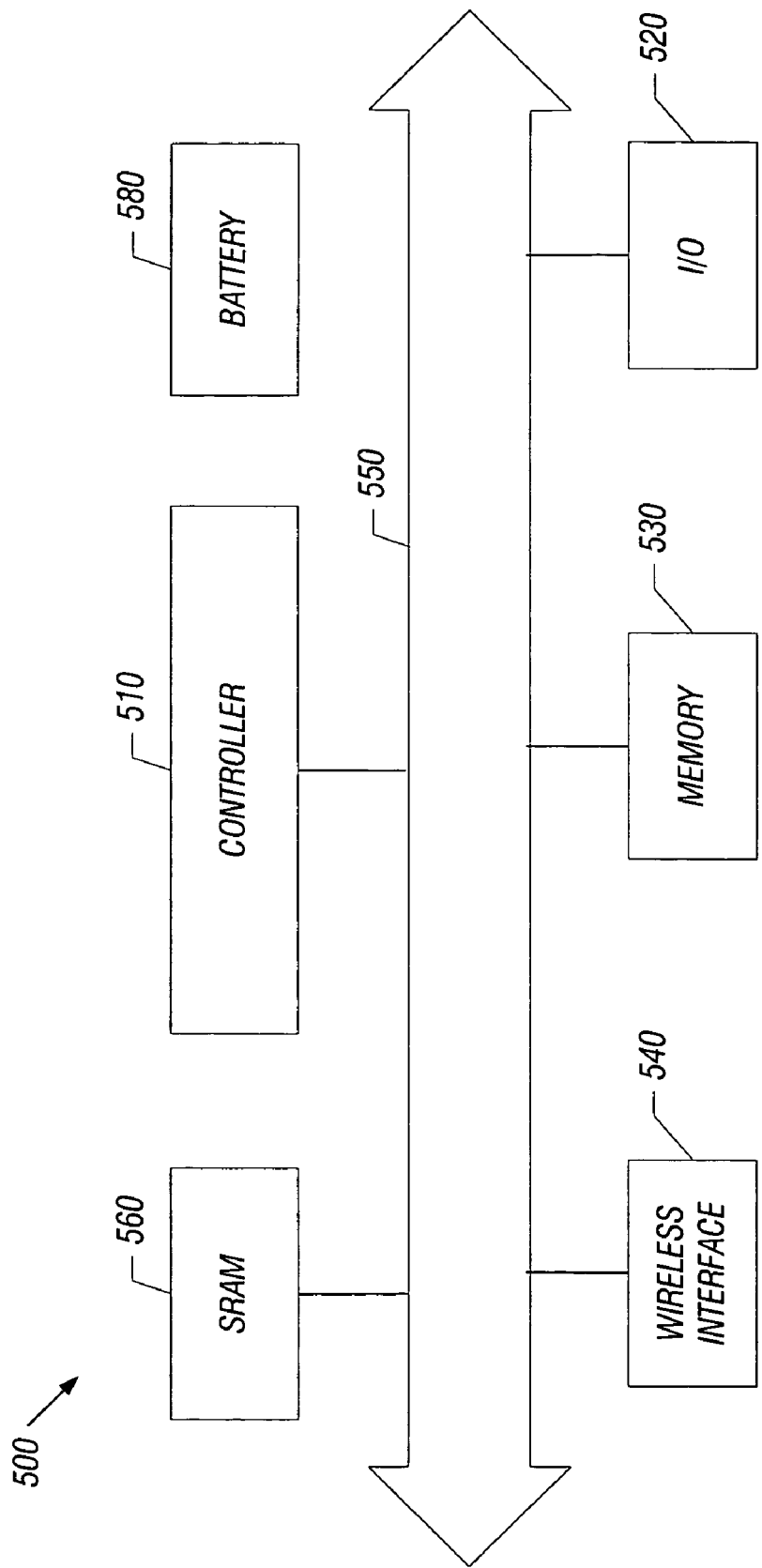
FIG. 12 is a schematic depiction of a system in accordance with one embodiment of the present invention.

Turning to FIG. 12, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or phase change memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A method comprising:
   forming, over a surface feature, a mask including two vertical and one non-vertical portions;
   removing said surface feature and the non-vertical portion of said mask; and
   using said vertical portions of said mask as a mask to etch a phase change material to define two cells in said phase change material at the same time.

2. The method of claim 1 including forming a layer of phase change material over a substrate, defining a feature over said phase change material, covering said feature with a deposited mask and removing a horizontal portion of said mask.

3. The method of claim 2 including forming a vertical portion on two opposed ends of said feature and using said vertical portions to define two cells in said phase change material.

4. The method of claim 3 including defining said cells at sublithographic feature size.

5. The method of claim 3 including forming said mask at a thickness less than a lithographic feature size.

6. The method of claim 1 including defining a phase change material stack including at least two opposed electrodes and an intervening layer of phase change material and etching said stack using said mask.

7. The method of claim 1 including covering said etched phase change material with an encapsulation layer.

8. The method of claim 1 including forming a first set of electrodes under said phase change material and forming a second set of electrodes extending transversely to said first set extending over said phase change material.

9. The method of claim 8 including using said second set of electrodes as a mask to etch said phase change material.

* * * * *